US012800662B2

United States Patent
(12) United States Patent
Wang

(10) Patent No.: US 12,800,662 B2
(45) Date of Patent: Nov. 17, 2026

(54) SOLID STATE BATTERY TESTING DEVICE AND METHOD OF USING THE SAME

(71) Applicant: MilesAhead Energy, LLC, Dayton, OH (US)

(72) Inventor: Yuxing Wang, Dayton, OH (US)

(73) Assignee: MilesAhead Energy, LLC, Dayton, OH (US)

( * ) Notice: Subject to any disclaimer, the term of this patent is extended or adjusted under 35 U.S.C. 154(b) by 143 days.

(21) Appl. No.: 18/972,075

(22) Filed: Dec. 6, 2024

(65) Prior Publication Data

US 2025/0199073 A1 Jun. 19, 2025

Related U.S. Application Data

(60) Provisional application No. 63/610,719, filed on Dec. 15, 2023.

(51) Int. Cl.

| | |
|---|---|
| ***G01R 31/36*** | (2020.01) |
| ***G01R 31/378*** | (2019.01) |
| ***G01R 31/382*** | (2019.01) |
| ***H01M 10/42*** | (2006.01) |

(52) U.S. Cl.

CPC ....... *G01R 31/3644* (2013.01); *G01R 31/378* (2019.01); *G01R 31/382* (2019.01); *H01M 10/4285* (2013.01)

(58) Field of Classification Search

CPC .............. G01R 31/3644; G01R 31/378; G01R 31/382; H01M 10/4285; Y02E 60/10

See application file for complete search history.

(56) References Cited

U.S. PATENT DOCUMENTS

| | | | | | |
|---|---|---|---|---|---|
| 3,946,751 | A * | 3/1976 | Breiter | H01M 10/3909 | 429/174 |
| 4,053,692 | A * | 10/1977 | Dey | H01M 50/186 | 429/185 |
| 4,609,598 | A * | 9/1986 | Tucholski | H01M 50/562 | 429/185 |

(Continued)

FOREIGN PATENT DOCUMENTS

| | | |
|---|---|---|
| CN | 212622957 U | 2/2021 |
| CN | 114705367 A | 7/2022 |
| CN | 219915467 U | 10/2023 |

OTHER PUBLICATIONS

International Search Report and Written Opinion dated Feb. 6, 2025, for International Application No. PCT/US2024/058877, 11 pages.

*Primary Examiner* — Vinh P Nguyen
(74) *Attorney, Agent, or Firm* — FBT Gibbons LLP; Alexander J. Johnson; Vance V. VanDrake, III

(57) ABSTRACT

The disclosed embodiment provide a solid-state battery testing device that provides uniform pressure over the test cell and which provides a hermetic seal to protect the cell. The solid-state battery testing device includes a cell module, a pressure control module, and an environment control module. The pressure control module utilizes a single lead screw and the cell module contains a swivel-type plunger assembly to apply uniform pressure to a solid-state battery contained within the cell module. The environment control module utilizes all inorganic components to provide a low leak-rate and cost-effective sealing solution.

19 Claims, 6 Drawing Sheets

(56) References Cited

U.S. PATENT DOCUMENTS

| | | | | |
|---|---|---|---|---|
| 5,981,100 | A * | 11/1999 | Rouhani ........... | H01M 10/0468 429/90 |
| 6,407,553 | B1 * | 6/2002 | Anderson ............ | H01M 50/119 324/443 |
| 2003/0118898 | A1 | 6/2003 | Kimura et al. | |
| 2003/0235735 | A1 | 12/2003 | Miyazawa et al. | |
| 2009/0142660 | A1 | 6/2009 | Hori et al. | |
| 2011/0174084 | A1 * | 7/2011 | West ................... | H01M 10/445 324/157 |

* cited by examiner

SOLID STATE BATTERY TESTING DEVICE AND METHOD OF USING THE SAME

CROSS-REFERENCE TO RELATED APPLICATIONS

This application claims priority to U.S. Provisional Patent Application No. 63/610,719, filed Dec. 15, 2023, the entirety of which is incorporated by reference herein for all purposes.

TECHNICAL FIELD

Disclosed embodiments relate to the field of solid-state batteries and testing devices. More specifically, the disclosed embodiments relate to a solid-state sulfur cathode and a testing device which can exert and maintain a uniform pressure over a test sample and can provide a hermetic barrier between the test cell and the outside environment, all while being easy to operate while having a small overall footprint.

BACKGROUND

Currently, a vast majority of batteries that are used in portable electronics and in electric vehicles are lithium-ion batteries, wherein the electrolyte material is in the liquid state during both the assembly and normal operating conditions. In a solid-state battery, all the components are in their solid state during both the assembly and normal operating conditions. Inorganic-type solid-state batteries are a sub-category in and of themselves, wherein the electrolyte materials utilize inorganic materials such as sulfide, halide, oxide, and similar materials. The fabrication and testing procedure of these types of batteries are very different from those of traditional lithium-ion batteries. Therefore, commercial solutions for fabricating and testing laboratory-scale lithium-ion batteries cannot be used to fabricate and test solid-state batteries.

A typical laboratory-scale solid-state battery testing device utilizes an insulating sleeve, typically made from PEEK plastic, and the conductive materials are most commonly various grade of steel and titanium. The solid-state battery itself can be typically fabricated by sequentially pressing and pelletizing the solid electrolyte and electrode materials. A voltage may then be established between the top and bottom parts of the device made from conductive materials, as they are in contact with the positive and negative electrode of the battery.

Solid-state batteries, in particular, inorganic-type solid-state batteries, generally need a high stack pressure of greater than 1 MPa to achieve optimal performance. Therefore, a clamping mechanism can usually be deployed to maintain a certain stack pressure on the solid-state battery. Most often, the clamping force can be controlled by tightening a plurality of screws on the top of the device, and equally controlling each screw can be a challenge. In other embodiments, devices use compression screws to control the pressure, but this provides a lack of flexibility as the adjustment of the cell stack pressure would have to use new compression springs with different spring constants. Furthermore, as most solid-state batteries degrade in ambient air, the entire assembly can either be tested inside a glovebox (an enclosed chamber filled with inert gas), or it must be placed in a hermetically sealed vessel.

This disclosure aims to address the need for the ability to exert and maintain a uniform pressure on the battery, while being able to be tested within an extended temperature range, and to be able to be tested outside of a glovebox type environment.

BRIEF DESCRIPTION OF THE DRAWINGS

The disclosed aspects will hereinafter be described in conjunction with the appended drawings, provided to illustrate and not to limit the disclosed aspects, wherein like designations denote like elements.

DETAILED DESCRIPTION

Figure 1:
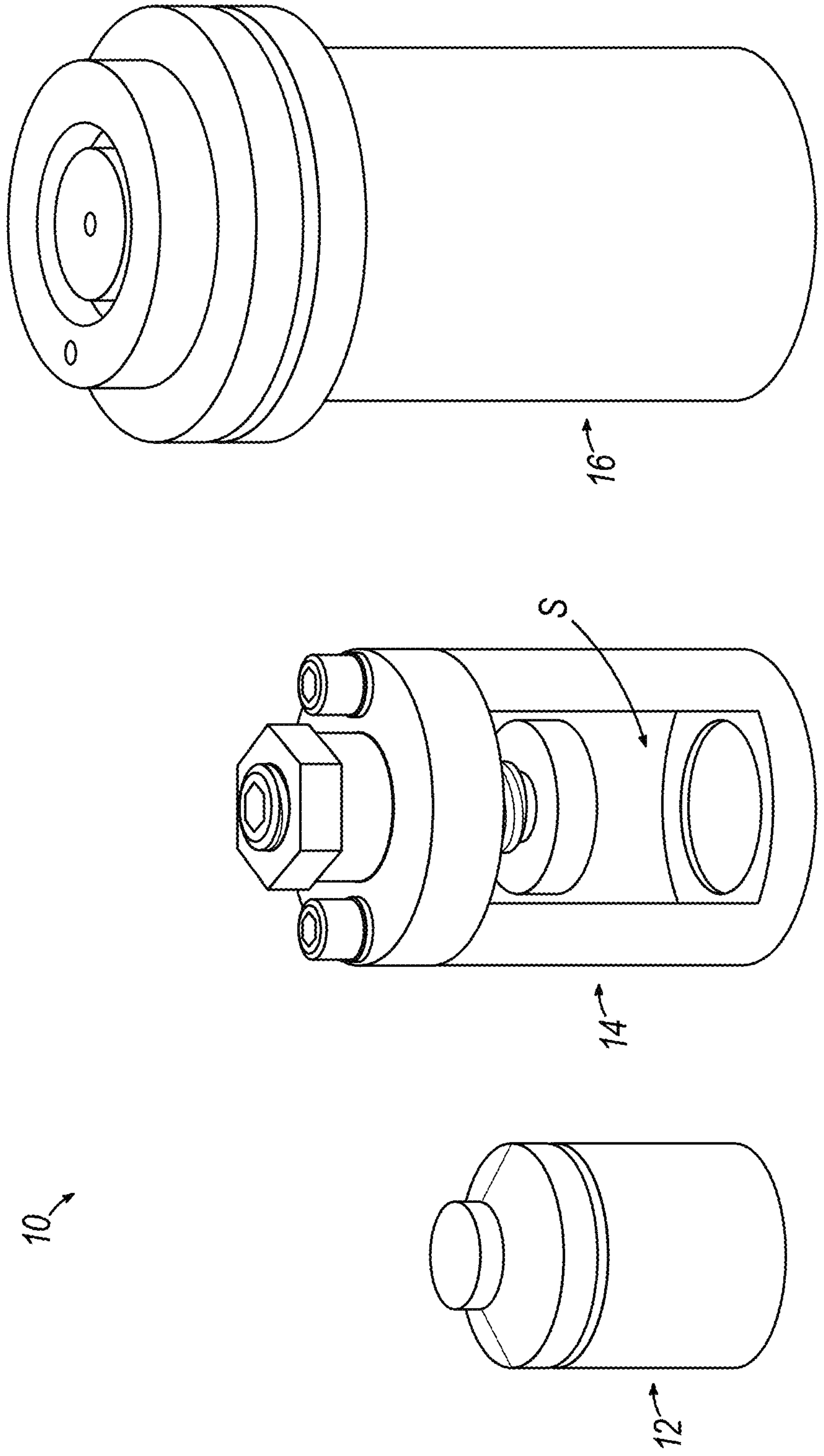
FIG. 1 is a perspective view of the various modules of an embodiment of the solid-state battery testing device of the present disclosure.

In the following detailed description, reference is made to the accompanying drawings which form a part hereof wherein like numerals designate like parts throughout, and in which is shown by way of illustration embodiments that may be practiced. It is to be understood that other embodiments may be utilized, and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The challenges that the present disclosure set out to overcome in the solid-state battery testing environment are to provide a clamping device that can exert and maintain a uniform pressure of up to 50 MPa over the test sample; being able to test the device at an extended temperature range of −50° C. to 100° C.; being able to utilize a sealing mechanism that can maintain an airtight seal over an extended period of time as the accumulation of ppm levels of moisture could impact cell performance; to be able to provide positive and negative electrodes that are electrically insulated; and to be able to provide a testing device that can be compact and easy to operate.

As shown in FIG. 1, a testing device 10 of the present disclosure may include a cell module 12, a pressure control module 14, and an environment control module 16. Throughout the present disclosure, cell module 12 may be referred to as battery module 12, pressure control module 14 may be referred to as clamping device 14, and environment control module 16 may be referred to as sealing vessel 16. In one or more embodiments, a solid-state battery may be fabricated within the confines of cell module 12, which may then be placed within pressure control module 14, and then pressure control module 14 (with the cell module 12 loaded therein) may then be placed within environment control module 16 to form testing device 10. In one or more embodiments, the assembly of the solid-state battery and testing performed on device 10, takes place in a glovebox environment. However, due to the features of environment control module 16 discussed below, once device 10 has been assembled, device 10 can be safely removed from the glovebox to test the solid-state battery in different conditions that are not feasible to test for within a glovebox.

Figure 2:
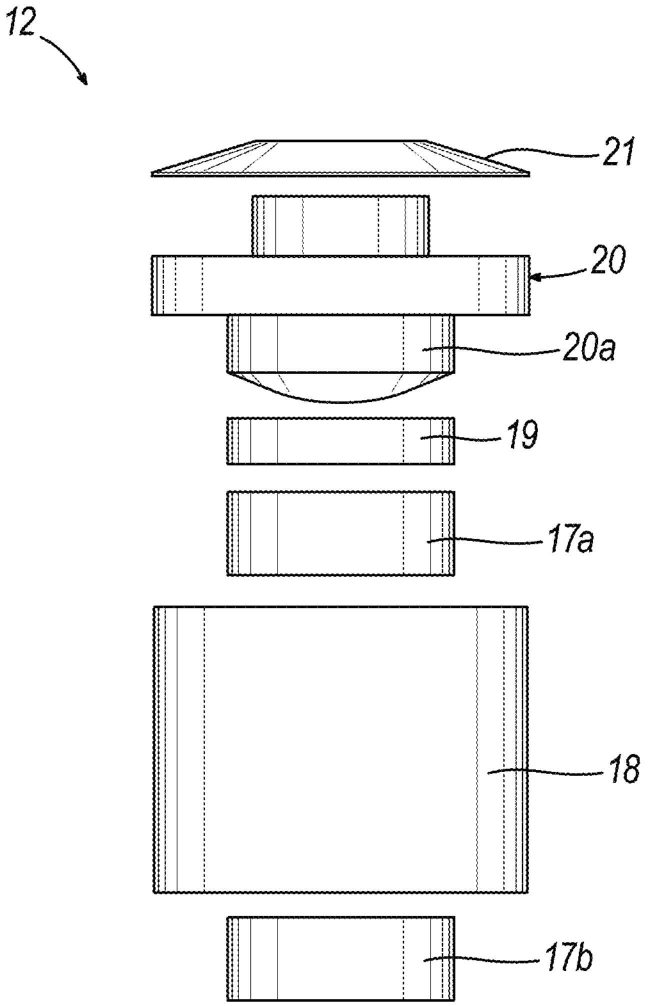
FIG. 2 is a perspective exploded view of a cell module of the solid-state battery testing device of FIG. 1.

As shown in FIG. 2, cell module 12 may include a sleeve 18, two current collectors 17*a* and 17*b*, a ball-headed plunger 20, a plunger receptacle 19, and at least one disc spring 21. In one or more versions, one of current collectors 17*a* or 17*b*, is for the positive electrode of the solid-state battery within cell module 12, and the other of current collector 17*b* or 17*a* is for the negative electrode of the solid-state battery within cell module 12. In one or more embodiments, current collectors 17*a* and 17*b* are made from either stainless steel or titanium alloys as these materials are compatible with both positive and negative electrodes. In one or more embodiments, ball-head 20*a* of ball-headed plunger 20 and plunger receptable 19 may have the same sphere-type curvature so ball-headed plunger 20 can freely tilt while maintaining tight contact with plunger receptacle 19 once ball-headed plunger 20 has been placed into contact with plunger receptacle 19. In one or more embodiments, sleeve 18 can be made of a plastic material that can be electrically insulating or sleeve 18 may comprise a plastic lined-metal cylinder. In one or more embodiments, the plastic material included in sleeve 18 can include polyetherether ketone (PEEK), polyamide-imide, polycarbonate, or combinations thereof. In one or more embodiments, ball-headed plunger 20, plunger receptacle 19, and current collectors 17*a*, 17*b* can be made from a metallic material and ball-headed plunger 20 and current collectors 17*a*, 17*b* can be electrically conductive.

In one or more embodiments, the metallic material that makes ball-headed plunger 20, plunger receptacle 19, and current collectors 17*a*, 17*b* can include any metallic material that satisfies mechanical and corrosion requirements. In one or more embodiments, current collectors 17*a*, 17*b* may be compressed to at least 300 MPa, so the yield stress of the material that makes current collectors 17*a*, 17*b* should be at least twice that (e.g., greater than 600 MPa). In one or more embodiments, since ball-headed plunger 20 is not in contact with the electrode materials of the solid-state battery within cell module 12, as long as the material plunger 20 is made from does not react with any gas that may be generated during testing, then there may be no special requirements for the material plunger 20 is made from. The material plunger 20 may be made from should have good wear resistance.

Figure 4:
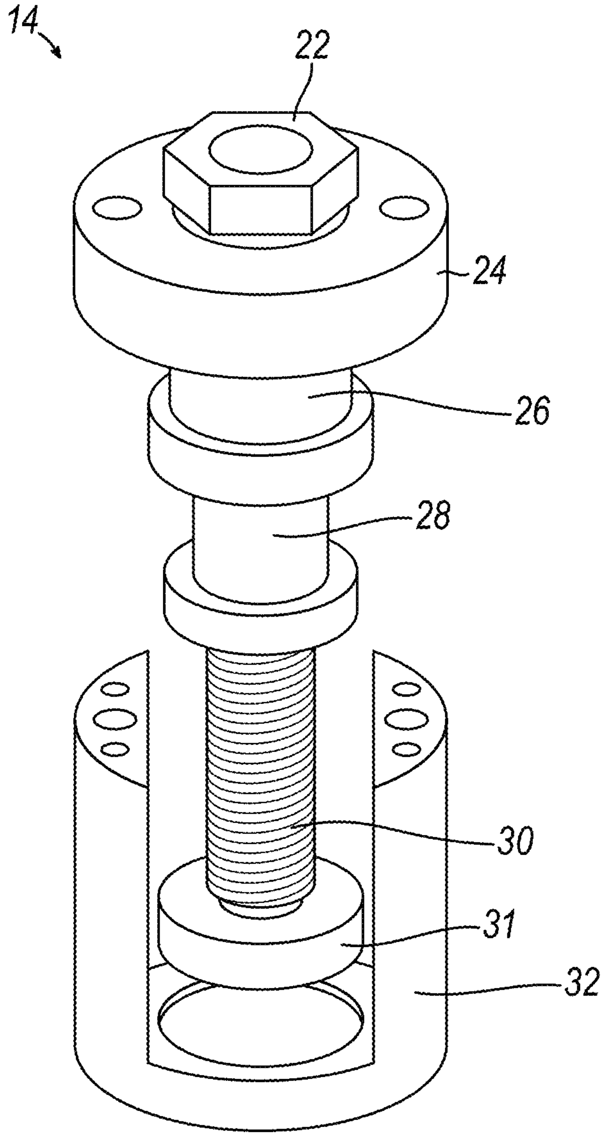
FIG. 4 is a perspective exploded view of a pressure control module of the solid-state battery testing device of FIG. 1.

FIG. 4 shows an exploded view of various components of an embodiment of pressure control module 14. Pressure control module 14 may include a locking nut 22, a top plate 24, an insulation ring 26, a center nut 28, a lead screw 30 having a screw plate 31, and a cell holder 32. In one or more embodiments, top plate 24, insulation ring 26, center nut 28, lead screw 30, and cell holder 32 are pre-assembled such that there can be no need to separate these components during the assembly and disassembly process of testing a solid-state battery. Battery module 12 can be designed to be able to slide into the pressure control module 14 from either of the side openings S of the pressure control module 14 (as called out in FIG. 1). Ball-headed plunger 20 can tilt slightly to compensate for the small axial mismatch between the formed solid-state battery and lead screw 30 of pressure-control module 14, ensuring uniform application of pressure over the cell.

Figure 5B:
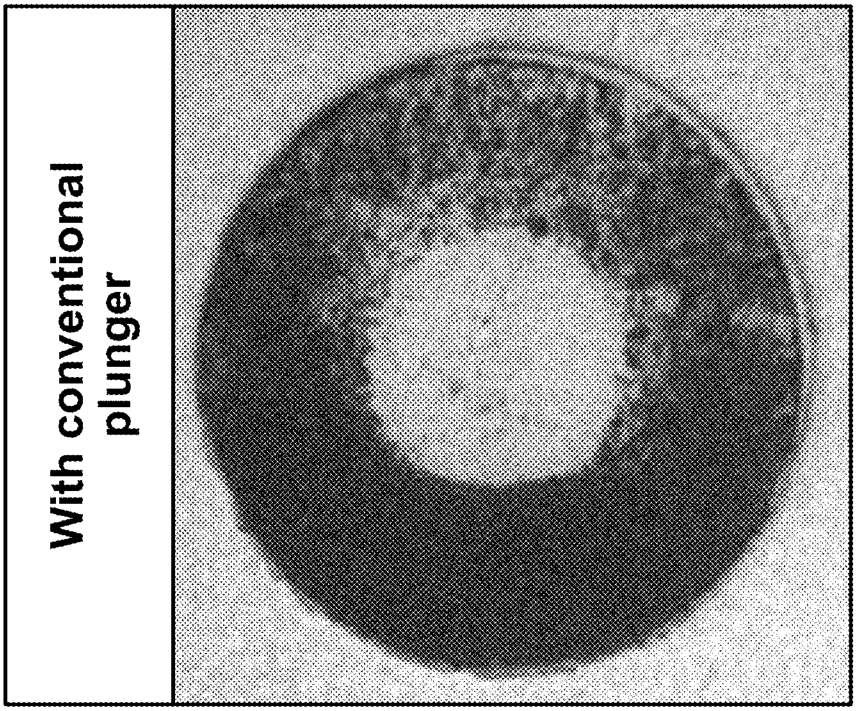
FIG. 5B shows the aftereffects of a pressure-sensitive film when pressed with a conventional plunger design.
Figure 5A:
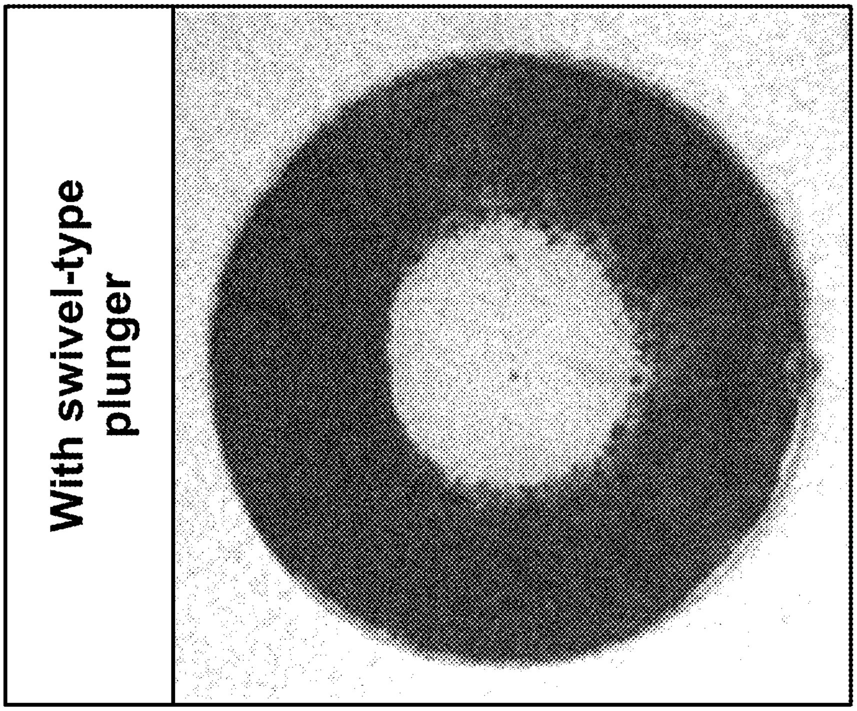
FIG. 5A shows the aftereffects of a pressure-sensitive film when pressed with a swivel design of the pressure control module of FIG. 3.

Such action from ball-headed plunger 20 allows for a swivel design and relationship between ball-headed plunger 20 and plunger receptacle 19. The swivel design present in pressure control module 14 allows for an even distribution of pressure as shown in FIG. 5A versus an uneven distribution of pressure as shown when using a conventional plunger design as shown in FIG. 5B. Specifically, FIGS. 5A and 5B show the results of a pressure-sensitive film when pressed with a swivel design of pressure control module 14 (FIG. 5A) versus a conventional plunger design (FIG. 5B). To generate these images, a pressure sensitive film was placed between a current collector and a conventional plunger and then between the same current collector and plunger receptacle 19. Both cells were pressed to 7 MPa. Areas with more color indicates higher pressure. It can be seen that when the conventional plunger was used, the pressure was higher on one side than the opposite side. In contrast, when plunger receptacle 19 was used, the pressure was much more even over the entire area.

In one or more embodiments, locking nut 22, top plate 24, center nut 28, lead screw 30, and the cell holder 32 can be made from a metallic material and can be electrically conductive. In one or more embodiments, the metallic material that makes the locking nut 22, top plate 24, center nut 28, lead screw 30, and the cell holder 32 can include various grades of alloy steel or stainless steel. In one or more embodiments, the choice of the exact metallic material will depend on the mechanical and corrosion requirements of the specific end use of the testing device 10. For example, if the solid-state battery being tested was sulfide based, then there could be $H_2S$ outgassing during the test, so it is preferred that all metal used has good corrosion resistance against $H_2S$. If the solid-state battery being tested is halide based, for example, contains chlorine, then HCl will be generated and all metal used should have good corrosion resistance against HCl. In one or more embodiments, insulation ring 26 can be made of a plastic material that can be electrically insulating. In one or more embodiments, the plastic material that forms insulation ring 26 can include materials with a low creep rate at the testing temperature and pressure utilized by the testing device 10 such as PEEK, polytetrafluoroethylene (PTFE), polyamide-imide, polycarbonate, and combinations thereof.

Figure 3:
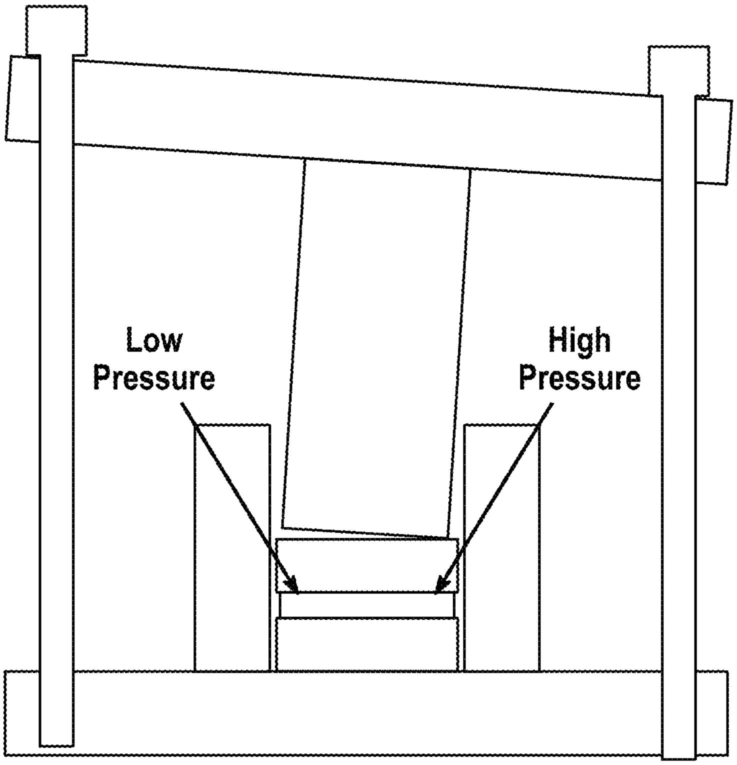
FIG. 3 PRIOR ART
FIG. 3 is a view of a pressure control module of a prior art device.

Pressure can be applied to the solid-state battery within the battery module 12 through lead screw 30 which may be situated coaxial with the battery module 12. Prior art solutions utilize pressure application through more than one screw typically located near the peripherals of the device. It can be difficult to tighten more than one screw the exact same amount, so the pressure applied to the solid-state battery within prior art solutions can be uneven, as shown in FIG. 3. With device 10 of the present disclosure, lead screw 30 can be coaxial with battery module 12 by design. Pressure can then be applied through lead screw 30 onto the at least one disc spring 21. The amount of compression on the at least one disc spring 21 can be adjusted through manipulation of lead screw 30, which may affect the stack pressure on the solid-state battery within battery module 12. In practice, once the materials that form the solid-state battery have been assembled, such as an electrolyte, a positive electrode, and a negative electrode, these materials are pressed tightly together by a hydraulic press. However, platens on the hydraulic press employed to form the solid-state battery may not be perfectly parallel, resulting in the normal axis of the solid-state battery being out of alignment with the center axis of lead screw 30. This issue can be rectified by the swivel design and relationship between ball-headed plunger 20 and plunger receptacle 19 as discussed above in reference to FIGS. 5A and 5B. If there is any misalignment from cell holder 32 to lead screw 30, ball-headed plunger 20 may tilt slightly to align with lead screw 30, while the bottom surface of the plunger receptacle 19 remains to be in perfect contact with upper current collector 17*a*. Because of the ball-headed design of plunger 20, the contact area between ball-headed plunger 20 and plunger receptacle 19 remains the same despite the tilt.

Insulation between the positive and negative electrode of the solid-state battery within the battery module 12 can be achieved through insulation ring 26 between center nut 28 and top plate 24. In this configuration, both top plate 24 and the cell holder 32 act as the same electrode. Such a design reduces the chance of an electrical shortage during the assembly and simplifies the design needed for environment control module 16.

Figure 6:
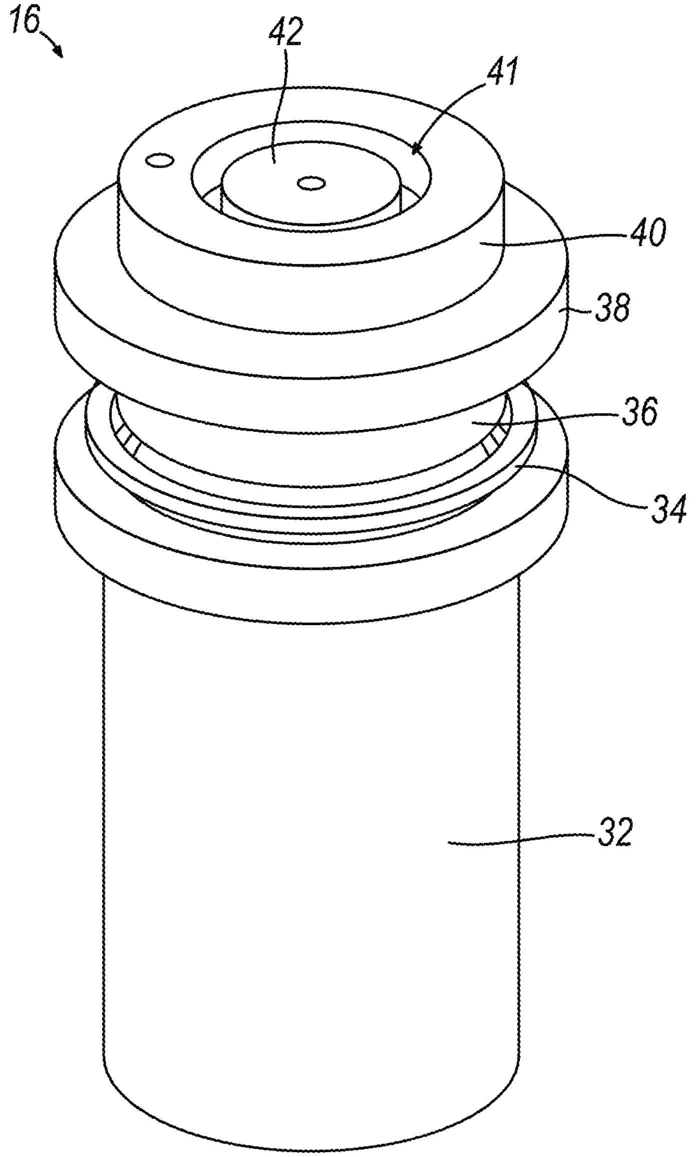
FIG. 6 is a perspective exploded view of an environment control module of the solid-state battery testing device of FIG. 1.

FIG. 6 shows an exploded view of various components of an embodiment of environment control module 16. Environment control module 16 may include a cup lid 38, a centering ring 36, a sealing gasket 34, and a bottom cup 32. In one or more embodiments, bottom cup 32 hosts the assembled cell module 12 seated within the assembled pressure control module 14. Sealing gasket 34 provides a sealing surface between bottom cup 32 and cup lid 38. In one or more embodiments, cup lid 38 may include a metal outer ring 40 and a metal inner piece 42 separated by a glass ring 41. In one or more embodiments, metal outer ring 40, metal inner piece 42, and glass ring 41 may be processed to form cup lid 38 using a metal-to-glass sealing method so the helium leak rate through cup lid 38 is less than 10^−9 cc/sec.

During testing, the helium leak rate through cup lid 38 was measured using a Varian 938-41 leak detector. The Varian 938-41 leak detector was calibrated with a helium calibrated leak rate of 5.8×10^(−8) cc/sec. Four separate samples were measured, and the results are shown below in Table 1. All samples showed a leak rate below the detection limit of the Varian 938-41 leak detector, which is 1×10^(−9) cc/sec. Water vapor can ingress into a sealed vessel in two ways: 1) through the gaps between the sealing surfaces, which is measured by the leak rate test, or 2) through the materials of the vessel's outer body. Inorganic materials such as glass and metal have extremely low water vapor permeability, e.g., less than 10^(−14) cm3·cm/cm2·s·Torr, so the water ingression through the glass can be negligible. Over the span of a year, assuming device 10 is stored at room temperature with a humidity of 50%, the calculated total water vapor ingression based on the measured leak rate of cup lid 38 is 0.1 mg. In contrast, organic materials have much higher water vapor permeability, so even if the leak through the gaps between the sealing surfaces is negligible, water ingression through the sealing materials can still be high if a plastic gasket is used for sealing. For example, if a PTFE gasket (33 mm in outer diameter, 31 mm in inner diameter and 0.5 mm in thickness) is used for the sealing of device 10, under the same storage condition, the calculated total water vapor ingression based on a water permeability of 5×10^(−11) cm3·cm/cm2·s·Torr is 5.8 mg, which is significantly higher.

TABLE 1

| Sample No. | 1 | 2 | 3 | 4 |
|---|---|---|---|---|
| Helium leak rate (cc/sec) | <1 × 10^(−9) | <1 × 10^(−9) | <1 × 10^(−9) | <1 × 10^(−9) |

In one or more embodiments, sealing gasket 34 can be made from a metallic material. In one or more embodiments, the metallic material of sealing gasket 34 can include various grades of aluminum, copper, alloyed copper, or any other soft metal. The use of a metallic material to form sealing gasket 34 provides advantages as opposed to using an electrically insulating material as the material to form sealing gasket 34. Due to the highly sensitive nature of a solid-state battery, high fidelity may be a needed attribute for sealing gasket 34. For instance, if sealing gasket 34 was made from a PTFE material instead of sealing gasket 34 being made from a metallic material, the initial sealing may be satisfactory, but in the long term, a PTFE gasket can deform due to creep, and the contact pressure at the sealing face may therefore decrease, which may inevitably result in a leak. In all plastic materials, creep becomes exacerbated at elevated temperatures, such as 100° C. In addition, all plastic materials have a water permeability several magnitudes higher than that of metallic materials, so over the long term, water ingression can be severe if plastic sealing gaskets are used.

With the use of a metallic material in sealing gasket 34, unlike a plastic gasket, the creep-induced deformation of sealing gasket 34 can be extremely low at elevated temperatures, such as 100° C. Sealing gasket 34 being made from a metallic material allows for sealing gasket 34 to deliver long-term and high-fidelity sealing performances. Furthermore, making sealing gasket 34 from a metallic material also for sealing gasket 34 to also be electrically conductive, and therefore separation of the two electrodes within the solid-state battery within cell module 12 can be achieved by glass ring 41 of cup lid 38.

All solid-state lithium sulfur batteries include a solid-state sulfur cathode and a lithium anode. This provides the advantages of high energy density, good safety, and low cost. However, there are technical challenges in production of both the cathode and anode when their end use may be in rechargeable batteries. Since the design and performance of the cathode and anode are independent to a large degree, innovations in the sulfur cathodes are applicable to other types of lithium batteries such as solid-state batteries with sulfur cathodes and silicon anodes, or applicable to all-solid-state sodium sulfur batteries. The main issues with solid-state sulfur cathode production include low power density due to poor transport properties; and poor cycle life due to large volume changes during cycling.

Therefore, in one or more embodiments, a solid-state cathode of the present disclosure can overcome the issues of poor cycle life due to large volume changes during cycling. In one or more embodiments, such a solid-state cathode of the present disclosure can be prepared in a five-step method. First, pure sulfur and porous conductive carbon may be mixed. In one or more embodiments, porous conductive carbons may include BLACK PEARLS® 2000 by Cabot Corporation and Ketjenblack EC-600JD. In one or more embodiments, the mixing method of pure sulfur and porous conductive carbon could include manual mixing using pestle and mortar or other machine-assisted mixing methods such as wet or dry mixing with a jar mill, planetary ball mill, cutting mill, and or a knife mill.

In a second step, the sulfur/carbon mixture can be heated at above the melting point of sulfur, preferably above 155° C. in a vacuum. This step may be repeated to ensure that the sulfur infiltrates the pores of the conductive carbon completely.

In a third step, the sulfur/carbon mixture can then be milled with a sulfide material that may contain sulfur, lithium, phosphorus, tin, chlorine, bromine, iodine, or combinations thereof. In one or more embodiments, the energy input of the milling method should be high enough to allow the sulfur and the sulfide materials to react mechanochemically. This step forms a cathode dry powder mixture.

In a fourth step, the cathode dry power can be mixed with a binder to form a dough. In one or more embodiments, the binder may be a polymer that is chemically compatible with the sulfur cathode mixture, such as PTFE or PVDF. In one or more embodiments, the binder can improve the electrical contact between the cathode components during the cycling of the cathode.

In a fifth step, the dough is rolled into a film and laminated with a current collector. In one or more embodiments, the current collector may be coated or uncoated aluminum foil or stainless-steel foil.

To test the sulfur cathode created according to the steps above, discs can be punched out from the dough coated film and then assembled in a testing device, such as testing device 10 disclosed above.

In one or more embodiments, once a solid-state battery has been created, the following steps may be taken to insert the solid-state battery into testing device 10. Plunger receptacle 19 and ball-headed plunger 20 are placed in position within sleeve 18. At least one disc spring 21 may then be placed on the ball-headed plunger 20. Cell module 12 may then be inserted into pressure control module 14, which may be considered a first configuration that forms a cell/pressure control module. The desired pressure is then applied by manipulating lead screw 30. Lead screw 30 may then be locked with locking nut 22. Pressure control module 14 may then be inserted into bottom cup 32, then centering ring 36 and sealing gasket 34 may be placed. A connecting spring (not shown) may then be placed on locking nut 22 so that locking nut 22 may be electrically connected to a center part of cup lid 38. Cup lid 38 may then be placed over bottom cup 32 and sealing gasket 34 may be pressed at a pressure sufficient to deform sealing gasket 34 and form a hermetic seal. This forming of a hermetic seal may be considered a second configuration that forms the solid-state battery testing device 10. Finally, cup lid 38 and bottom cup 32 may be clamped together with a KF clamp (not shown) while pressure is being applied.

The following examples relate to various non-exhaustive ways in which the teachings herein may be combined or applied. The following examples are not intended to restrict the coverage of any claims that may be presented at any time in this application or in subsequent filings of this application. No disclaimer is intended. The following examples are being provided for nothing more than merely illustrative purposes. It is contemplated that the various teachings herein may be arranged and applied in numerous other ways. It is also contemplated that some variations may omit certain features referred to in the below examples. Therefore, none of the aspects or features referred to below should be deemed critical unless otherwise explicitly indicated as such at a later date by the inventors or by a successor in interest to the inventors. If any claims are presented in this application or in subsequent filings related to this application that include additional features beyond those referred to below, those additional features shall not be presumed to have been added for any reason relating to patentability.

Example 1

A solid-state battery testing device comprising: a cell module, a pressure control module, and an environment control module, wherein the cell module is placeable within the pressure control module, and wherein the pressure control module is placeable within the environment control module such that placing the cell module within the pressure control module and the pressure control module within the environmental control module allows for a hermetic seal to be formed.

Example 2

The solid-state battery testing device of Example 1, wherein the cell module includes a sleeve, a first and second current collector, a ball-headed plunger, a plunger receptacle, and at least one disc spring; wherein the first and second current collector are placeable within the sleeve, wherein the plunger receptacle is placeable on top of one of either the first or second current collector, wherein the ball-headed plunger is placeable on top of the plunger receptacle, and wherein the at least one disc spring is placeable on top of the ball-headed plunger.

Example 3

The solid-state battery testing device of Example 2, wherein the ball-headed plunger has a ball head having a first sphere-type curvature and wherein the plunger receptacle has a second sphere-type curvature such that ball-headed plunger is tiltable when in contact with the plunger receptacle.

Example 4

The solid-state battery testing device of Example 2, wherein the ball-headed plunger, plunger receptacle, and the two current collectors are made from a metallic material.

Example 5

The solid-state battery testing device of Example 2, wherein the ball-headed plunger and the two current collectors are electrically conductive.

Example 6

The solid-state battery testing device of Example 1, wherein the pressure control module includes a locking nut, a top plate, an insulation ring, a center nut, a lead screw having a screw plate, and a cell holder; wherein the screw plate is movable up and down within the cell holder by a driving action of the lead screw.

Example 7

The solid-state battery testing device of Example 6, wherein the locking nut, the top plate, the center nut, the lead screw, and the cell holder are made from a metallic material.

Example 8

The solid-state battery testing device of Example 6, wherein the locking nut, the top plate, the center nut, the lead screw, and the cell holder are made from a metallic material are electrically conductive, and wherein the insulating ring is made from a plastic material.

Example 9

The solid-state battery testing device of Example 1, wherein the environmental control module includes a cup lid, a centering ring, a sealing gasket, and a bottom cup; wherein the sealing gasket provides a sealing surface between the cup lid and the bottom cup.

Example 10

The solid-state battery testing device of Example 9, wherein the cup lid includes a metal outer ring, a metal inner piece, and a glass ring; wherein the metal outer ring is separated from the metal inner piece by the glass ring.

Example 11

The solid-state battery testing device of Example 10, wherein the cup lid is formed by a metal-to-glass sealing method between the metal outer ring, the metal inner piece, and the glass ring such that cup lid has a helium leak rate of less than 10^−9 cc/sec.

Example 12

The solid-state battery testing device of Example 9, wherein the sealing gasket is made from a metallic material.

Example 13

A method of securing a solid-state battery within a solid-state battery testing device, the method comprising: providing a sleeve, a first and second current collectors, a ball-headed plunger, a plunger receptacle, and at least one disc spring; creating a solid-state battery within the sleeve of the cell module; placing the first current collector below the solid-state battery and the second current collector above the solid-state battery; positioning the plunger receptacle above the second current collector, the ball-headed plunger above the plunger receptable, and the at least one disc spring above the ball-headed plunger to form a cell module; placing the cell module within a pressure control module; and placing the pressure control module within an environment control module to form the solid-state battery testing device.

Example 14

The method of Example 13, wherein prior to the step of placing the pressure control module within an environment control module, the method further includes applying pressure to the at least one disc spring by manipulation of a lead screw of the pressure control module.

Example 15

The method of Example 13, wherein the step of placing the pressure control module within an environment control module includes inserting the pressure control module within a bottom cup of the environment control module.

Example 16

The method of Example 15, further comprising placing a centering ring and a sealing gasket of the environmental control module over the pressure control module within the environment control module.

Example 17

The method of Example 16, further comprising placing a cup lid of the environmental control module over the centering ring and the sealing gasket.

Example 18

The method of Example 17, further comprising applying pressure to the cup lid to deform the sealing gasket to create a hermetic seal.

Example 19

The method of Example 18, further comprising applying a clamp to the cup lid and bottom cup.

Example 20

A solid-state battery testing system, the system comprising: providing a cell module, the cell module comprising; a sleeve, a first and second current collector, a ball-headed plunger, a plunger receptacle, and at least one disc spring; providing a pressure control module, the pressure control module comprising; a locking nut, a top plate, an insulation ring, a center nut, a lead screw having a screw plate, and a cell holder; providing an environmental control module, the environmental control module comprising; a cup lid, a centering ring, a sealing gasket, and a bottom cup; wherein the solid-state battery testing system has a first configuration wherein the cell module is placeable within the pressure control module to form a cell/pressure control module;

wherein the solid-state battery testing system has a second configuration wherein the cell/pressure control module is placeable within the environmental control module to form a solid-state battery testing device; and wherein the solid-state battery testing device in the second configuration includes a hermetic seal It should be understood that any one or more of the teachings, expressions, embodiments, examples, etc. described herein may be combined with any one or more of the other teachings, expressions, embodiments, examples, etc. that are described herein. The above-described teachings, expressions, embodiments, examples, etc. should therefore not be viewed in isolation relative to each other. Various suitable ways in which the teachings herein may be combined will be readily apparent to those skilled in the art in view of the teachings herein. Such modifications and variations are intended to be included within the scope of the claims.

It should be appreciated that any patent, publication, or other disclosure material, in whole or in part, that is said to be incorporated by reference herein is incorporated herein only to the extent that the incorporated material does not conflict with existing definitions or other disclosure material set forth in this disclosure. As such, and to the extent necessary, the disclosure as explicitly set forth herein supersedes any conflicting material incorporated herein by reference. Any material, or portion thereof, that is said to be incorporated by reference herein, but which conflicts with existing definitions or other disclosure material set forth herein will only be incorporated to the extent that no conflict arises between that incorporated material and the existing disclosure material.

Versions described above may be designed to be disposed of after a single use, or they can be designed to be used multiple times. Versions may, in either or both cases, be reconditioned for reuse after at least one use. Reconditioning may include any combination of the steps of disassembly of the device, followed by cleaning or replacement of particular pieces, and subsequent reassembly. In particular, some versions of the device may be disassembled, and any number of the particular pieces or parts of the device may be selectively replaced or removed in any combination. Upon cleaning and/or replacement of particular parts, some versions of the device may be reassembled for subsequent use either at a reconditioning facility, or by an operator immediately prior to a procedure. Those skilled in the art will appreciate that reconditioning of a device may utilize a variety of techniques for disassembly, cleaning/replacement, and reassembly. Use of such techniques, and the resulting reconditioned device, are all within the scope of the present application.

Having shown and described various embodiments of the present invention, further adaptations of the methods and systems described herein may be accomplished by appropriate modifications by one of ordinary skill in the art without departing from the scope of the present invention. Several such potential modifications have been mentioned, and others will be apparent to those skilled in the art. For instance, the examples, embodiments, geometrics, materials, dimensions, ratios, steps, and the like discussed above are illustrative and are not required. Accordingly, the scope of the present invention should be considered in terms of the following claims and is understood not to be limited to the details of structure and operation shown and described in the specification and drawings.

What is claimed is:

1. A solid-state battery testing device comprising:

a cell module, wherein the cell module includes:

- a sleeve,
- a first and second current collector placeable within the sleeve,
- a plunger receptacle placeable on top of one or either the first or second current collector,
- a ball-headed plunger placeable on top of the plunger receptacle, and
- at least one disc-spring placeable on top of the ball-headed plunger, a pressure control module, and an environment control module, wherein the cell module is placeable within the pressure control module, and wherein the pressure control module is placeable within the environment control module such that placing the cell module within the pressure control module and the pressure control module within the environmental control module allows for a hermetic seal to be formed.

2. The solid-state battery testing device of claim 1, wherein the ball-headed plunger has a ball head having a first sphere-type curvature and wherein the plunger receptacle has a second sphere-type curvature such that ball-headed plunger is tiltable when in contact with the plunger receptacle.

3. The solid-state battery testing device of claim 1, wherein the ball-headed plunger, plunger receptacle, and the two current collectors are made from a metallic material.

4. The solid-state battery testing device of claim 1, wherein the ball-headed plunger and the two current collectors are electrically conductive.

5. The solid-state battery testing device of claim 1, wherein the pressure control module includes a locking nut, a top plate, an insulation ring, a center nut, a lead screw having a screw plate, and a cell holder; wherein the screw plate is movable up and down within the cell holder by a driving action of the lead screw.

6. The solid-state battery testing device of claim 5, wherein the locking nut, the top plate, the center nut, the lead screw, and the cell holder are made from a metallic material.

7. The solid-state battery testing device of claim 5, wherein the locking nut, the top plate, the center nut, the lead screw, and the cell holder are made from a metallic material are electrically conductive, and wherein the insulating ring is made from a plastic material.

8. The solid-state battery testing device of claim 1, wherein the environmental control module includes a cup lid, a centering ring, a sealing gasket, and a bottom cup; wherein the sealing gasket provides a sealing surface between the cup lid and the bottom cup.

9. The solid-state battery testing device of claim 8, wherein the cup lid includes a metal outer ring, a metal inner piece, and a glass ring; wherein the metal outer ring is separated from the metal inner piece by the glass ring.

10. The solid-state battery testing device of claim 9, wherein the cup lid is formed by a metal-to-glass sealing method between the metal outer ring, the metal inner piece, and the glass ring such that cup lid has a helium leak rate of less than 10^−9 cc/sec.

11. The solid-state battery testing device of claim 8, wherein the sealing gasket is made from a metallic material.

12. A method of securing a solid-state battery within a solid-state battery testing device, the method comprising:

providing a sleeve, a first and second current collectors, a ball-headed plunger, a plunger receptacle, and at least one disc spring;

creating a solid-state battery within the sleeve of the cell module;

placing the first current collector below the solid-state battery and the second current collector above the solid-state battery;

positioning the plunger receptacle above the second current collector, the ball-headed plunger above the plunger receptable, and the at least one disc spring above the ball-headed plunger to form a cell module;

placing the cell module within a pressure control module; and placing the pressure control module within an environment control module to form the solid-state battery testing device.

13. The method of claim 12, wherein prior to the step of placing the pressure control module within an environment control module, the method further includes applying pressure to the at least one disc spring by manipulation of a lead screw of the pressure control module.

14. The method of claim 12, wherein the step of placing the pressure control module within an environment control module includes inserting the pressure control module within a bottom cup of the environment control module.

15. The method of claim 14, further comprising placing a centering ring and a sealing gasket of the environmental control module over the pressure control module within the environment control module.

16. The method of claim 15, further comprising placing a cup lid of the environmental control module over the centering ring and the sealing gasket.

17. The method of claim 16, further comprising applying pressure to the cup lid to deform the sealing gasket to create a hermetic seal.

18. The method of claim 17, further comprising applying a clamp to the cup lid and bottom cup.

19. A solid-state battery testing system, the system comprising:

providing a cell module, the cell module comprising;

a sleeve, a first and second current collector, a ball-headed plunger, a plunger receptacle, and at least one disc spring;

providing a pressure control module, the pressure control module comprising;

a locking nut, a top plate, an insulation ring, a center nut, a lead screw having a screw plate, and a cell holder;

providing an environmental control module, the environmental control module comprising;

a cup lid, a centering ring, a sealing gasket, and a bottom cup;

wherein the solid-state battery testing system has a first configuration wherein the cell module is placeable within the pressure control module to form a cell/pressure control module; wherein the solid-state battery testing system has a second configuration wherein the cell/pressure control module is placeable within the environmental control module to form a solid-state battery testing device; and wherein the solid-state battery testing device in the second configuration includes a hermetic seal.

* * * * *